(12) United States Patent
Todsen et al.

(10) Patent No.: US 7,047,263 B2
(45) Date of Patent: May 16, 2006

(54) FAST-SETTLING DIGITAL FILTER AND METHOD FOR ANALOG-TO-DIGITAL CONVERTERS

(75) Inventors: James L. Todsen, Tucson, AZ (US); Ka Y. Leung, Austin, TX (US); Timothy V. Kalthoff, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 453 days.

(21) Appl. No.: 09/929,855

(22) Filed: Aug. 14, 2001

(65) Prior Publication Data

US 2003/0037083 A1   Feb. 20, 2003

(51) Int. Cl.
*G06F 17/17* (2006.01)
*G06F 17/10* (2006.01)

(52) U.S. Cl. ...................... 708/313; 708/316
(58) Field of Classification Search .................. 78/313, 78/316; 341/61
See application file for complete search history.

(56) References Cited

U.S. PATENT DOCUMENTS

| 4,943,807 | A |   | 7/1990 | Early et al. |
|---|---|---|---|---|
| 5,502,747 | A | * | 3/1996 | McGrath .................. 375/350 |
| 5,659,586 | A |   | 8/1997 | Chun |

(Continued)

OTHER PUBLICATIONS

Hogenauer, Eugene, "*An Economical Class of Digital Filters for Decimation and Interpolation,*" IEEE Technical Paper, vol. ASSP-29, No. 2, Apr. 1981, pp 155-162.

Maxim, *+3V, 18-Bit, Low-Power, Multichannel, Oversampling (Sigma-Delta) ADC*, Apr. 1999, pp 1-36.

*Primary Examiner*—Tan V. Mai
(74) *Attorney, Agent, or Firm*—W. Daniel Swayze, Jr.; W. James Brady; Frederick J. Telecky, Jr.

(57) ABSTRACT

A technique and circuit is provided for facilitating a faster settling time for a digital filter for use with an analog-to-digital converter. An exemplary technique utilizes a composite filter for a faster settling, lower noise resolution filter in a parallel configuration with a slower settling, higher noise resolution filter. As a result, valid data can be received faster for processing by the analog-to-digital converter. In addition, a composite digital filter circuit can include a three filter configuration including a fast-settling, low resolution first filter, a slower-settling, higher resolution second filter, and an even slower-settling, even higher resolution third filter, each of the filters configured in a parallel arrangement. Additional or fewer filters can also be provided. Moreover, the gain of each filter path can be suitably matched to the gain of any other filter path in the digital filter circuit to provide a filter output having an equalized gain regardless of the filter path selected. For example, a filter path can be suitably configured with a multiplier component such that an equalized gain can be realized for each filter path. In addition, the various filters of the digital filter circuit can be configured within the parallel arrangement to provide reduce layout requirements through the sharing of components. For example, a second filter can share at least two integrators with the third filter, and the first filter can share at least one integrator with the third filter. Further, the digital filter can be suitably configured for operation in various industrial applications. For example, the first filter can be suitably configured with a notch filter configured to replace the first, third and other odd harmonic notches of the first filter.

28 Claims, 4 Drawing Sheets

U.S. PATENT DOCUMENTS

| | | |
|---|---|---|
| 5,777,909 A | 7/1998 | Leung et al. |
| 5,892,693 A * | 4/1999 | Mou .................. 708/313 |
| 5,987,484 A | 11/1999 | Sherry et al. |
| 6,134,268 A * | 10/2000 | McCoy .................. 375/229 |
| 6,317,765 B1 * | 11/2001 | Page et al. .................. 708/313 |
| 6,487,573 B1 * | 11/2002 | Jiang et al. .................. 708/313 |
| 6,531,969 B1 * | 3/2003 | Chu .................. 708/313 |
| 6,668,029 B1 * | 12/2003 | Koslov et al. .................. 708/313 |
| 6,718,354 B1 * | 4/2004 | Mou .................. 708/313 |
| 2001/0021939 A1 * | 9/2001 | Schollhorn .................. 708/313 |

* cited by examiner

FAST-SETTLING DIGITAL FILTER AND METHOD FOR ANALOG-TO-DIGITAL CONVERTERS

FIELD OF INVENTION

The present invention relates to a digital filter for use in analog-to-digital converters. More particularly, the present invention relates to a method and digital filter circuit for facilitating a fast-settling time for input data.

BACKGROUND OF THE INVENTION

The demand for more reliable integrated circuit components for use in communication, instrumentation and high-quality video applications continues to increase. As a result, integrated circuit manufacturers are requiring for such components and devices to meet the design requirements of a myriad of emerging applications. In particular, integrated circuit manufacturers are requiring analog-to-digital converters and related components to continue to improve data rates, noise reduction, and accuracy.

A popular technique for implementing analog-to-digital converters includes the use of delta-sigma modulation wherein an analog voltage is input to a delta-sigma modulator. Such modulators produce noise, e.g., quantization and thermal noise, which must be filtered out by the digital filter. The digital filter generally uses decimation in the filtering process, with the result that the digital data is processed at a much slower rate than the output rate of the modulator, e.g., by digitally converting the sampling rate of the signal from a given rate to a lower rate. This filtering process is generally operable to remove large amounts of noise at the cost of reducing the bandwidth of the analog-to-digital converter.

While these delta-sigma analog-to-digital converter techniques can provide lower noise characteristics, these techniques can result in slower settling times, i.e., present techniques, although capable of reducing noise, can provide increases in the response time of the digital filter resulting from changes in the input signal, and thus have an undesirable amount of delay before valid data is provided to the analog-to-digital converter.

One approach for improving the settling time is disclosed in U.S. Pat. No. 5,777,911, for "Digital Filtering System", issued Jul. 7, 1998 to Sherry et al. ("Sherry reference"). The Sherry reference discloses the use of two filters configured in series, wherein the first filter is configured to operate at a fixed rate while the second filter is configured to operate at an adjustable rate. During operation, the second filter is receiving output samples from the first filter and averaging those samples to provide an averaged output signal. This operation can result in an increased settling time, but also with a higher resolution. As the input signal provides a step change, the step change is detected at the output of the first filter. As a result, the second filter will flush the currently averaged samples, and thereafter begin sampling and averaging only the new data using a faster settling time.

While the Sherry reference discloses a technique which attempts to address the above problems regarding the increased settling time of digital filters, there are drawbacks. For example, the technique uses two filters operating in series, with the first filter operating at a fixed rate having an undesirable additional delay. To address this additional delay, the Sherry technique requires that the modulator, in addition to the second filter, operate at a higher data rate, which results in higher power consumption.

With reference to FIG. 1, a block diagram of a multiplexed, delta-sigma modulator and digital filter for an analog-to-digital converter is illustrated. A multiplexor 102 is coupled with multiple input channels to provide an output from the selected input channel to a modulator 104 and a digital filter 106. A problems arises as the input channel is switched at multiplexor 102. When this switching of input channels occurs, the analog-to-digital converter must wait for digital filter 106 to settle before valid data can be received and processed. Digital filter 106 can comprise various types of filters having a built-in delay. For example, digital filter 106 can comprise a $sinc^x$-type filter, such as a $sinc^3$-type filter disclosed by E. B. Hogenauer in "An Economical Class of Digital Filters for Decimation and Interpolation", IEEE Transmission, Acoustics, Speech, Signal Processing, vol. ASSP-29, pp. 155–162, April 1981.

Accordingly, while the input channel can be switched from a first channel to a second channel to receive new input data signals, the analog-to-digital converter must wait for the settling time of the digital filter to be completed before accurate data can be received from a different input channel. This delay in waiting for valid data can be greatly affected by the type of modulator 104 selected, which dictates the group delay of digital filter 106. For example, in many applications the group delay can be 4 or 5 or more, such as applications requiring a sinc-type filter comprising a four or higher-delay filter that needs four or five cycles to settle before valid data can be read.

Other attempts for providing a faster response or more accurate digital filter have included the implementation of a faster settling $sinc^1$ filter in addition to a default $sinc^3$ filter, wherein the user can toggle between the two sinc filters depending on whether the application requires faster settling and less accuracy or slower settling and higher accuracy. However, such an approach does not provide a smooth transition between the two filters, but instead provides, at best, an option between a faster settling and lower resolution filter or a slower settling and higher resolution filter, rather than a composite filter including characteristics of both filters.

Accordingly, a need exists for a fast-settling digital filter technique and circuit for facilitating a faster response time to changes in the input channel of multiplexed, delta-sigma analog-to-digital filter.

SUMMARY OF THE INVENTION

The method and circuit according to the present invention addresses many of the shortcomings of the prior art. In accordance with various aspects of the present invention, a technique and circuit is provided for facilitating a faster settling time for a digital filter for use in an analog-to-digital converter. In accordance with one aspect of the present invention, an exemplary technique utilizes a composite filter comprising a faster settling, lower noise resolution filter in a parallel configuration with a slower settling, higher noise resolution filter. During operation, the faster settling filter can receive the initial sample of data and provide a filtered output signal, while the slower settling filter can receive and filter subsequent samples of data to provide a filtered output signal. As a result, valid data can be received faster for processing by the analog-to-digital converter.

In accordance with an exemplary embodiment of the present invention, a digital filter circuit can comprise a composite three filter configuration comprising a fast-settling, low resolution first filter, a slower-settling, higher resolution second filter, and an even slower-settling, even higher resolution third filter, each of the filters configured in a parallel arrangement. Additional or fewer filters can also be provided in accordance with various other exemplary embodiments. The digital filters can also comprise various types of filters, such as, for example, sinc-type filters, and/or include various delay configurations.

In accordance with another aspect of the present invention, the gain of each filter path can be suitably matched to the gain of any other filter path in the digital filter circuit to provide a filter output having an equalized gain regardless of the filter path selected. In accordance with this aspect of the present invention, a filter path is suitably configured with a multiplier component such that an equalized gain can be realized for each filter path.

In accordance with another aspect of the present invention, the various filters of the digital filter circuit can be configured within the parallel arrangement to provide reduce layout requirements through the sharing of components. For example, a second filter can share at least two integrators with the third filter, and the first filter can share at least one integrator with the third filter.

In accordance with another aspect of the present invention, the digital filter can be suitably configured for operation in various industrial applications. For example, the first filter can be suitably configured with a notch filter configured to replace the first, third and other odd harmonic notches of the first filter.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

Figure 1:
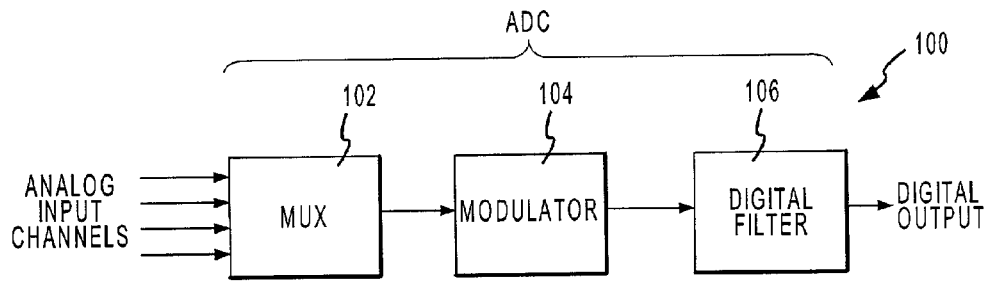
FIG. 1 illustrates a block diagram of a prior art multiplexor, modulator and filter circuit.

The present invention may be described herein in terms of various functional components and various processing steps. It should be appreciated that such functional components may be realized by any number of hardware or structural components configured to perform the specified functions. For example, the present invention may employ various integrated components, e.g., buffers, voltage references, current mirrors, signal processors and the like, comprised of various electrical devices, e.g., resistors, transistors, capacitors, diodes and other components whose values may be suitably configured for various intended purposes. In addition, the present invention may be practiced in any integrated circuit application where a fast-settling digital filter can be utilized. Such general applications that may be appreciated by those skilled in the art in light of the present disclosure are not described in detail herein. However for purposes of illustration only, exemplary embodiments of the present invention will be described herein in connection with a multiplexed, delta-sigma analog-to-digital converter. Further, it should be noted that while various components may be suitably coupled or connected to other components within exemplary circuits, such connections and couplings can be realized by direct connection between components, or by connection or coupling through other components and devices located therebetween.

As discussed above, prior art techniques for filtering signals for delta-sigma analog-to-digital converters have resulted in slower settling and response times of the digital filters. In addition, previous attempts for addressing the slow settling and response time problems include the providing of additional fixed delays which result in the need for higher data rates and power consumption. Other techniques have included the implementation of a $sinc_1$ filter in addition to a $sinc^3$ filter to provide a choice of one of a faster settling, less accurate filter or a slower settling, more accurate filter. However, in accordance with various aspects of the present invention, a technique and circuit is provided for facilitating a faster settling and response time for a digital filter for use with an analog-to-digital converter.

In accordance with one aspect of the present invention, an exemplary technique utilizes a composite filter comprising a faster settling, lower noise resolution digital filter in a parallel configuration with a slower settling, higher noise resolution digital filter. In accordance with this aspect, as the input channel is changed from one channel to another channel, the faster settling, lower noise resolution filter can suitably receive and filter the initial sample of data to provide an output data to the analog-to-digital converter. This data output resulting from the faster settling, lower noise resolution filter comprises accurate and valid data, but due to the lower noise resolution, may provide more noisy data. For a second or later sample of data, the slower settling, higher noise resolution digital filter is suitably selected to provide the output of data to the analog-to-digital converter after filtering the data. This second or later sample output of data is less susceptible to noise than the data provided by the faster settling, lower noise resolution filter. As a result, the composite digital filter circuit, i.e., the composite output of the two digital filters, realizes a faster settling time than prior art filters, and can suitably provide valid data to the analog-to-digital converter quickly after switching input channels at the multiplexor.

In accordance with an exemplary embodiment of the present invention, a composite digital filter circuit can comprise two or more filters configured in a parallel arrangement, wherein at least one of the filters comprises a faster settling, lower noise resolution digital filter while at least one other of the filters comprises a slower settling, higher noise resolution digital filter. For example, a composite digital filter circuit can comprise a three-filter configuration including a fast-settling, low noise resolution first filter, a slower-settling, higher noise resolution second filter, and an even slower-settling, higher noise resolution third filter, with each of the filters configured in a parallel arrangement. Further, a fourth, a fifth or additional filters can also be included within the parallel arrangement, with each successive filter comprising an even slower-settling, but higher resolution filter. Still further, the digital filters can comprise various type of filters, such as sinc-type filters, and/or include various delay configurations.

In addition, the group delay for each of the filters can be suitably configured according to the type of modulator utilized with the digital filter circuit. For example, for applications comprising a second order modulator, the slower settling, higher resolution digital filter can also comprise the same order delay filter, such as a two-delay filter. To improve the noise performance, applications can include a higher delay filter, for example a four or five-delay filter with the second order modulator. In addition, while such higher delay filters can be utilized, it should be noted that diminishing returns can be realized for sinc filters configured more than one delay higher. In other words, the digital filter can be sufficiently configured with only one delay higher than the order of the modulator, such as with applications comprising a third order modulator configured with a slower settling, higher resolution digital filter having a fourth order delay.

Figure 2:
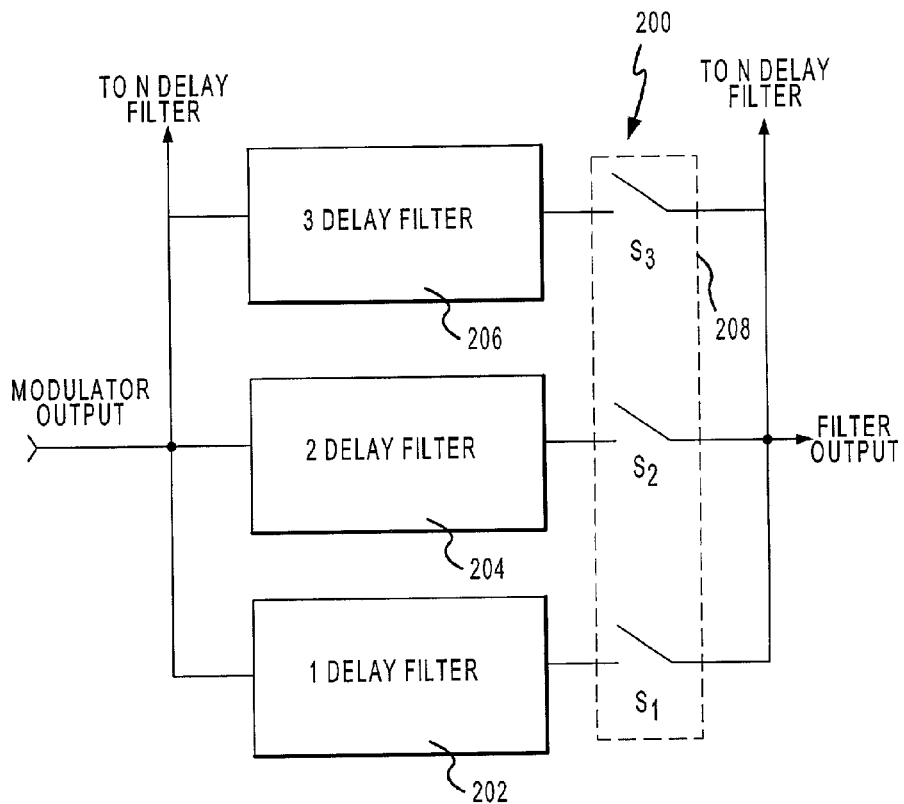
FIG. 2 illustrates a block diagram of a digital filter circuit in accordance with an exemplary embodiment of the present invention.

To facilitate a more detailed explanation of a digital filter circuit and technique in accordance with the present invention, with reference to FIG. 2, an exemplary composite digital filter circuit 200 is illustrated. Digital filter circuit 200 suitably comprises a composite filter including a first filter 202, a second filter 204 and a third filter 206, with each of filters 202, 204 and 206 being configured in a parallel arrangement, e.g., each of filters 202, 204 and 206 can be configured to receive a modulator output, and to provide a single filter output.

In accordance with this exemplary embodiment, first filter 202 suitably comprises a one delay filter, i.e., a filter configured to provide valid data after one clock cycle, one data rate, or one time unit occurs, and thus provide a fast settling or response time. While first filter 202 can provide valid data after a single cycle, the data output will contain more noise than filters 204 and 206. Second filter 204 suitably comprises a higher delay filter such as a two-delay filter configured to provide valid data after a second clock cycle occurs, and thus comprises a slower settling or response time than filter 202, but with less noise from a modulator. Meanwhile, third filter 202 suitably comprises a higher delay filter such as a three-delay filter, i.e., a filter configured to provide valid data after a third cycle of data occurs, and thus comprises an even slower settling time, but is even less susceptible to noise.

Filters 202, 204 and 206 can suitably comprise various types of filter configurations with various types of delay. In accordance with an exemplary embodiment, filters 202, 204 and 206 can suitably comprise sinc-type filters, i.e., a filter having a sinc function (sin x/x). In addition, filters 202, 204 and 206 can comprise $sinc^x$-type filters, such as Hogenauer $sinc^x$-type filters which can output data at 1/x of the settling rate. The $sinc^x$-type filters can also comprise various delay configurations, such as a $sinc^3$ filter having a three delay configuration to settle in three delay cycles, a $sinc^3$-type filter having a one-delay configuration which settles three times as long as a $sinc^1$-type filter, or any other like or in between delay configurations.

To improve the efficiency, filters 202, 204 and 206 can include decimation to reduce the output rate as compared to the input data rate. For example, while a modulator may be configured to sample at a rate of 1 Mhz, filters 202, 204 and 206 can be configured to provide data at a lower rate, such as at 1 Khz. Thus, filters 202, 204 and 206 can be configured to address noise, such as the noise created by the quantization of the modulator, through averaging of the input data received. In addition, any form or configuration of decimation can be included within filters 202, 204 and 206, for example, filter 202 may average 100 samples, filter 204 may average 200 samples, and filter 206 may average 300 samples, or any other arrangement of the number of samples may be suitably implemented before providing an output of data.

Each of filters 202, 204 and 206 are configured to provide output data after every cycle in composite filter 200. However, depending on the settling time of each filter, valid data may not be available from each filter until more than one data cycle has occurred. To determine whether to utilize the data output from first filter 202, second filter 204 and third filter 206, digital filter circuit 200 can also include a switching mechanism 208. To facilitate an understanding of switching mechanism 208, FIG. 2 provides a symbolic representation that illustrates switches S1, S2 and S3 suitably configured with filters 202, 204 and 206. However, in accordance with this embodiment, switching mechanism 208 need not comprise a switching device, but instead can suitably comprise any method, step, function or other mechanism for providing for the suitable selecting of output data from a filters 202, 204 and 206 to provide a composite filter output. For example, switch mechanism 208 can comprise a function or mechanism within a digital signal processor configured to suitably select an output from any one of filters 202, 204, and 206, with the output data of any remaining unselected filters ignored by switching mechanism 208. As a result of selecting the desired filter 202, 204 or 206 to provide the output, composite digital filter circuit 200 can provide a faster settling time than a single filter configuration, such as a single $sinc^3$-type filter.

Figure 3:
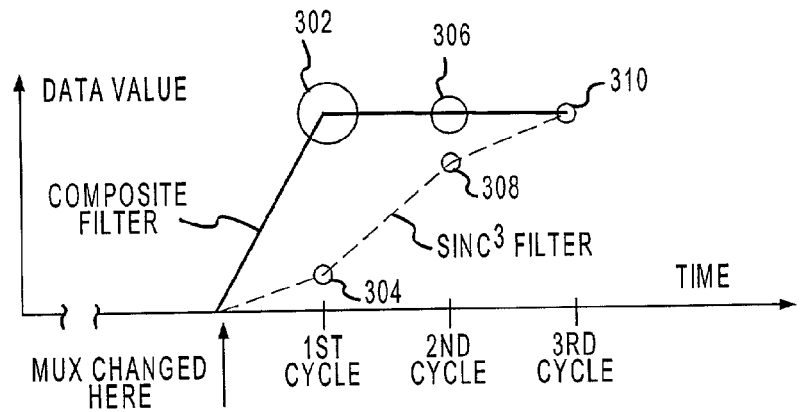
FIG. 3 illustrates a graph of exemplary output characteristics of an exemplary filter circuit in accordance with the present invention.

With reference to FIG. 3, an exemplary graph depicting the performance of composite digital filter 200 versus the performance of a single $sinc^3$ filter having three delay is illustrated. During initial operation of digital filter circuit 200, an input channel, for example a first channel, can be providing input signals from a multiplexor for sampling by a modulator. The output of the modulator can be suitably provided to filters 202, 204 and 206 to provide a filtered output. In this exemplary embodiment, first filter 202 is suitably configured to provide valid data from the first channel after a first data cycle, second filter 204 is suitably configured to provide valid data from the first channel after a second data cycle, and third filter 206 is suitably configured to provide valid data after a third data cycle, i.e., a storage component of third filter 206 is full of sampled data from the first channel after a third data cycle.

As illustrated by FIG. 3, upon the switching of an input channel, the data output for a single sinc-type filter, e.g., a three-delay filter such as a $sinc^3$-type filter, cannot provide a valid data value 310 until a third data cycle has been observed. However, in accordance with this exemplary embodiment of the present invention, upon the switching of the input channel, valid data can be obtained after a single data cycle by a composite filter comprising first filter 202 and second filter 204. For example, upon the switching of the input channel to a second channel, digital filter circuit 200 is configured such that switching mechanism 208 selects the output of first filter 202, e.g., switch S1 closes, and valid data can be output from filter 202 after the first data cycle. In other words, filter 202 comprises only sampled data from the second channel. For example, with reference to FIG. 3, digital filter 200 can provide a valid data value 302, which is significantly closer to the actual data of the second channel than a data value 304 provided by the single sinc$^3$-type filter. In addition, after the first data cycle, a storage component of second filter 204 suitably comprises one-half data from the first channel, with the remaining previous one-half of the data from the first channel shifted out and replaced with one-half data from the second channel. Meanwhile, a storage component of third filter 206 comprises two-thirds of data from the first channel, and the remaining one-third of old data from the first channel shifted out and replaced by one-third of data from the second channel, i.e., the storage component of third filter is one-third full of valid data from the second channel.

After a second or later clock cycle, digital filter circuit 200 is configured such that switching mechanism 208 selects the output of second filter 204, e.g., switch S2 closes, and valid data can be output in an output data signal from filter 204, i.e., filter 202 comprises only sampled data from the second channel collected during the first and second clock cycles. Accordingly, digital filter 200 can provide a valid data value 306, which is appreciably closer to the actual data of the second channel than a data value 308 provided by the single sinc$^3$-type filter, or by a single sinc$^1$-type filter (not illustrated). Meanwhile, third filter 206 comprises a one-third of data from the first channel, and the remaining two-thirds of data from the second channel, i.e., the storage component of third filter is two-thirds full of data from the second channel.

Upon waiting for a third or later clock cycle, digital filter circuit 200 is configured such that switching mechanism 208 selects the output of third filter 206, e.g., switch S3 closes, and valid data value 310 can be output from filter 206, i.e., all of the old data from the first channel has been shifted out and filter 206 comprises sampled data only from the second channel. Thereafter, as long as the multiplexor is providing data from the second channel, switching mechanism 208 can maintain third filter 206 suitably selected to provide the filtered output to the analog-to-digital filter.

Accordingly, through operation of an exemplary composite digital filter circuit 200, a faster-settling time can be realized upon the changing of an input channel in a multiplexor, as compared to prior art filter techniques using a single filter, such as a single sinc$^3$-type filter.

While the exemplary embodiment of a composite digital filter 200 comprises a three-filter configuration in the parallel arrangement, additional filters can be included within the parallel arrangement. For example, a fourth filter comprising a four-delay or higher filter can be configured in the parallel arrangement with filters 202, 204 or 206. Moreover, any other number of N filters comprising an Nth-delay filter can be configured within the parallel arrangement of digital filter circuit 200. Accordingly, upon reaching the Nth cycle of data, switching mechanism 208 can be suitably configured to select the output of the Nth filter to provide the filter output to the analog-to-digital converter.

In addition, depending on the order of any modulator coupled to digital filter circuit 200, in accordance with an exemplary embodiment, at least one filter comprises a delay configuration one delay higher than the order of modulator, e.g., if a 3$^{rd}$ order modulator is utilized, a 4$^{th}$ delay filter will be utilized in digital filter circuit 200. While even higher delay filters can be utilized, filters having more than one delay higher than the order of the modulator may be an unnecessary use of resources. Moreover, while digital filter 200 configured with a 3$^{rd}$ order modulator may comprise four filters having, for example, a 1$^{st}$ order delay, a 2$^{nd}$ order delay, a 3$^{rd}$ order delay, and a 4$^{th}$ order delay, more or less filters can be utilized. For example, when configured with a 3$^{rd}$ order modulator, digital filter 200 may include only two filters, e.g., a first filter with a 1$^{st}$ delay configuration or 2$^{nd}$ delay configuration, and a second filter with a 4$^{th}$ delay configuration.

As discussed above, composite digital filter circuit 200 is suitably configured to select the valid output data from one of the at least two filters in parallel. Depending on which filter path is selected, different gains may exist. In other words, the gain from the input of a filter to the output of a filter is a function of the filter characteristics, and thus different delay filters usually have different gain characteristics. However, in accordance with various other exemplary embodiments, it may be desirable for the gain of each filter to be identical to the gain of another filter. Thus, in accordance with another aspect of the present invention, the gain of each filter path is suitably matched to the gain of any other filter path in the digital filter circuit to provide a filter output having an equalized gain regardless of the filter path selected. In accordance with this aspect of the present invention, a filter path is suitably configured with a multiplier component such that an equalized gain is realized for each filter path.

Figure 4:
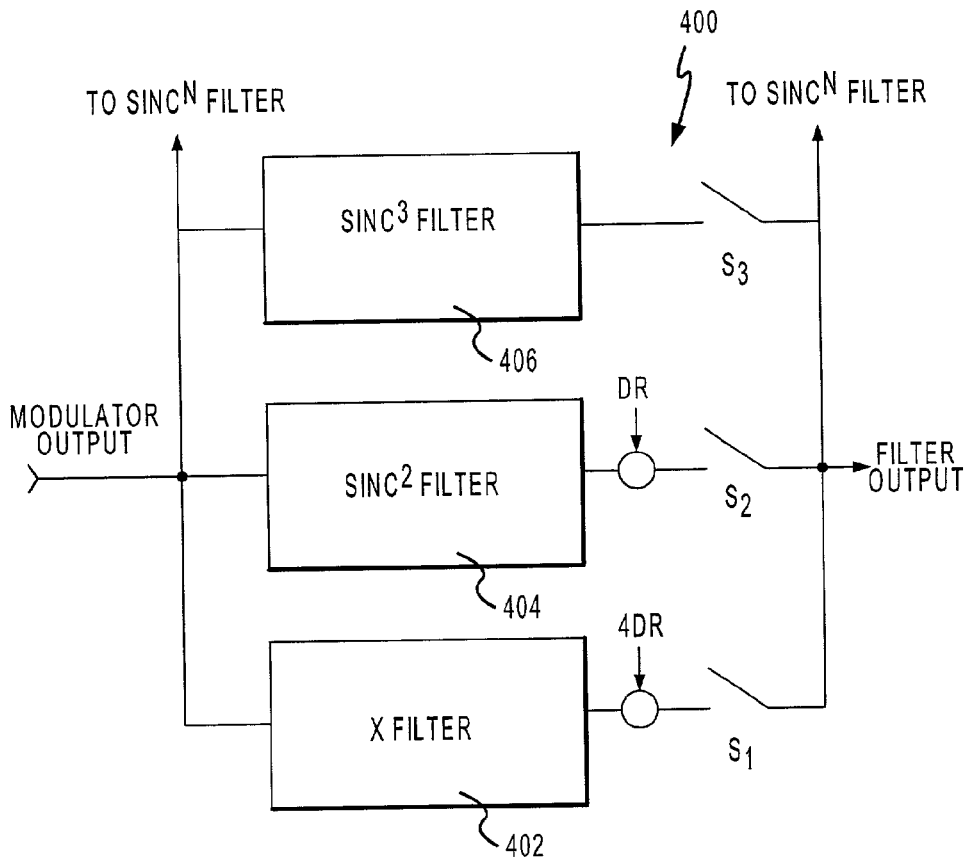
FIG. 4 illustrates a block diagram of a digital filter circuit in accordance with another exemplary embodiment of the present invention.

For example, with reference to FIG. 4, an exemplary composite digital filter circuit 400 having equalized gains is illustrated. Although additional or fewer filters as well as different filter types can be included within digital filter circuit 400, in accordance with an exemplary embodiment, digital filter circuit 400 comprises a first filter 402 comprising a sinc-type filter, e.g., a sinc$^1$ filter or fast sinc$^2$ filter, a second filter 404 comprising a sinc$^2$ filter, and a third filter 406 comprising a sinc$^3$ filter, with each filter 402, 404 and 406 suitably configured in a parallel arrangement. First filter 402 is configured with a first gain, such as, for example, DR$^2$/4, second filter 404 is configured with a second gain, such as DR$^2$, and third filter 406 suitably comprises a third gain of DR$^3$. The symbol DR is indicative of the decimation ratio, and illustrates that the gain component is a function of the decimation ratio. In addition, these gain configurations are mere illustrative of exemplary gains for filters 402, 404 and 406, and other gain configurations can also be suitably implemented in accordance with other exemplary embodiments.

In accordance with this embodiment, to provide an equalized gain for each gain path, for example an equalized gain of DR$^3$, digital filter circuit 400 suitably includes two multipliers configured within the paths of filters 402 and 404. Accordingly, a first multiplier of 4DR, e.g., a gain of four times the decimation ratio, is configured with first filter 402 to multiply the first gain of DR$^2$/4, thus resulting in an equalized gain of DR$^3$. In addition, a second multiplier of DR is configured with second filter 402 to multiply the first gain of DR$^2$, thus also resulting in an equalized gain of DR$^3$. As a result of the first and second multipliers, the resulting filtered output will provide an output signal having an equalized gain regardless of the filter path selected.

While first and second multipliers are shown configured within the filter path of each filter 402, 404 and 406, it should be noted that other arrangements can be realized. For example, first and second multipliers can be suitably configured downstream, such as after the filtered output. Accordingly, any implementation configured for normalizing the difference in the gains of the digital filters can be realized.

In addition, it should be noted that the above embodiment illustrating a first and second multiplier is merely exemplary, and that additional or fewer multipliers can be suitably included within various other exemplary embodiments. For example, first filter 402 could be configured with a first multiplier of 4, and third filter 406 could be configured with a second multiplier of 1/DR, such as to yield an equalized gain of DR², regardless of the filter path selected. In addition, second filter 402 could also include a third multiplier if desired. Accordingly, any number of multipliers having any gain value that can facilitate the normalization of gain functions in each filter path can be implemented in accordance with various exemplary embodiments of the present invention.

As discussed above, composite digital filter circuit 400 is suitably configured such that digital filters 402, 404 and 406 are configured in a parallel arrangement. This parallel arrangement can comprise each filter 402, 404 and 406 suitably connected to the output of a modulator and to the filter output terminal for interfacing to an analog-to-digital converter. However, this parallel arrangement can also comprise an arrangement configured to facilitate a reduction in the layout area required, such as by the sharing of various components within the digital filters.

Figure 5:
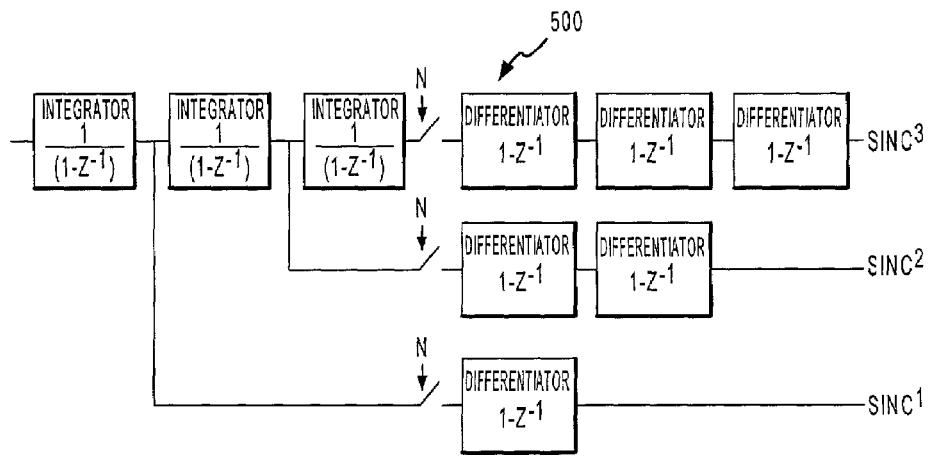
FIG. 5 illustrates a block diagram of an exemplary digital filter configuration in accordance with an exemplary embodiment of the present invention.

For example, with reference to FIG. 5, a composite digital filter circuit 500 is illustrated which comprises a sinc¹ filter, a sinc² filter and a sinc³ filter configured in a parallel arrangement. The sinc³ filter suitably comprises three integrators configured in series with three differentiators. While the sinc² filter can suitably comprise two separate integrators in series with two differentiators, in accordance with an exemplary embodiment, the sinc² filter is suitably configured to share two of the integrators with the sinc³ filter configuration. Moreover, the sinc¹ filter is suitably configured to share one of the integrators with the sinc³ filter configuration. As a result of the sharing arrangement, the layout area required for digital filter circuit 500 is suitably reduced. In addition, a power savings can be suitably realized from the reduction in hardware.

As discussed above, a composite filter configuration comprising a one-delay filter, a two-delay filter and a three-delay filter, such as a sinc¹ filter, a sinc² filter and a sinc³ filter, can suitably facilitate a faster-settling time that can be realized upon the changing of an input channel in a multiplexor, as compared to prior art filter techniques using a single sinc³-type filter. While this arrangement can provide a very desirable operation, the low noise distortion characteristics of the one-delay filter may be further improved in accordance with various other exemplary embodiments of the present invention. For example, the one-delay filter can be suitably replaced with a higher-order delay filter configured with a lower decimation rate.

Figure 6:
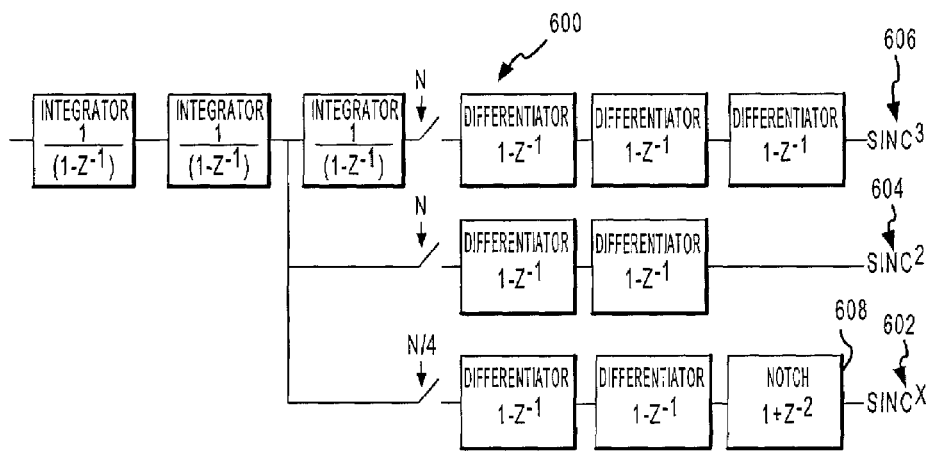
FIG. 6 illustrates a block diagram of another exemplary digital filter configuration in accordance with an exemplary embodiment of the present invention.

With reference to FIG. 6, another exemplary embodiment of a composite digital filter circuit 600 suitably comprises a first filter 602 comprising a higher-delay filter, configured in a parallel arrangement with a second filter 604 and a third filter 606. In accordance with this exemplary embodiment, first filter 602 suitably a two-delay filter, for example a sinc² filter. In addition, digital filter circuit 600 suitably comprises a second filter 604 comprising a two-delay filter such as a sinc² filter, and a third filter 606 comprising a three-delay filter, such as a sinc³ filter. Further, while first filter 602, second filter 604 and third filter 606 can suitably configured in other parallel arrangements, in accordance with this exemplary embodiment, filters 602, 604 and 606 are suitably configured in a sharing arrangement, i.e., various of the integrator components of third filter 606 can be suitably shared with filters 602 and 604.

While first filter 602 and second filter 604 can both be configured as sinc² filters, first filter 602 can also be configured to provide a faster output data rate than second filter 604. For example, digital filter circuit 600 can be suitably configured with different decimation ratio components configured to facilitate a faster output data rate for one filter versus another similarly configured filter. In accordance with an exemplary embodiment, second filter 604 and third filter 606 can be suitably configured with a decimation ratio of N, while first filter 602 can be configured with a lower decimation ratio, such as a ratio of N/4. As a result, first filter 602 can be suitably configured to decimate one-fourth as many samples as decimated by second filter 604, e.g., if second filter 604 receives 200 samples prior to providing a filtered output, first filter 602 can be configured to receive 50 samples prior to providing a filtered output.

While a one-fourth decimation ratio adjustment is illustrated, any other ratio adjustment configured to provide first filter 602 with a lower decimation ration can be utilized. Accordingly, first filter 602 can be suitably configured to operate at a faster output data rate than second filter 604. However, first filter 602 can also provide better resolution than a one-delay filter, such as a sinc¹ filter.

The above exemplary embodiments of digital filter circuits are suitably configured for operation in various environments. While the conditions can vary in each, in many industrial applications, various equipment and devices can generate noise existing at 60 Hz that can provide significant interference to the digital filter circuits. To address the problems created by the 60 Hz noise components, a notch filter can be suitably implemented within the digital filter circuits. For example, with reference to FIG. 7, a sinc 2 and a sinc3 filter response are illustrated which depict the notches occurring at every 60 Hz. In addition, the decimation rate and the overall clock rate can be suitably selected to provide a notch in the filter response to reduce or eliminate the impact of the 60 Hz noise components.

Figure 7:
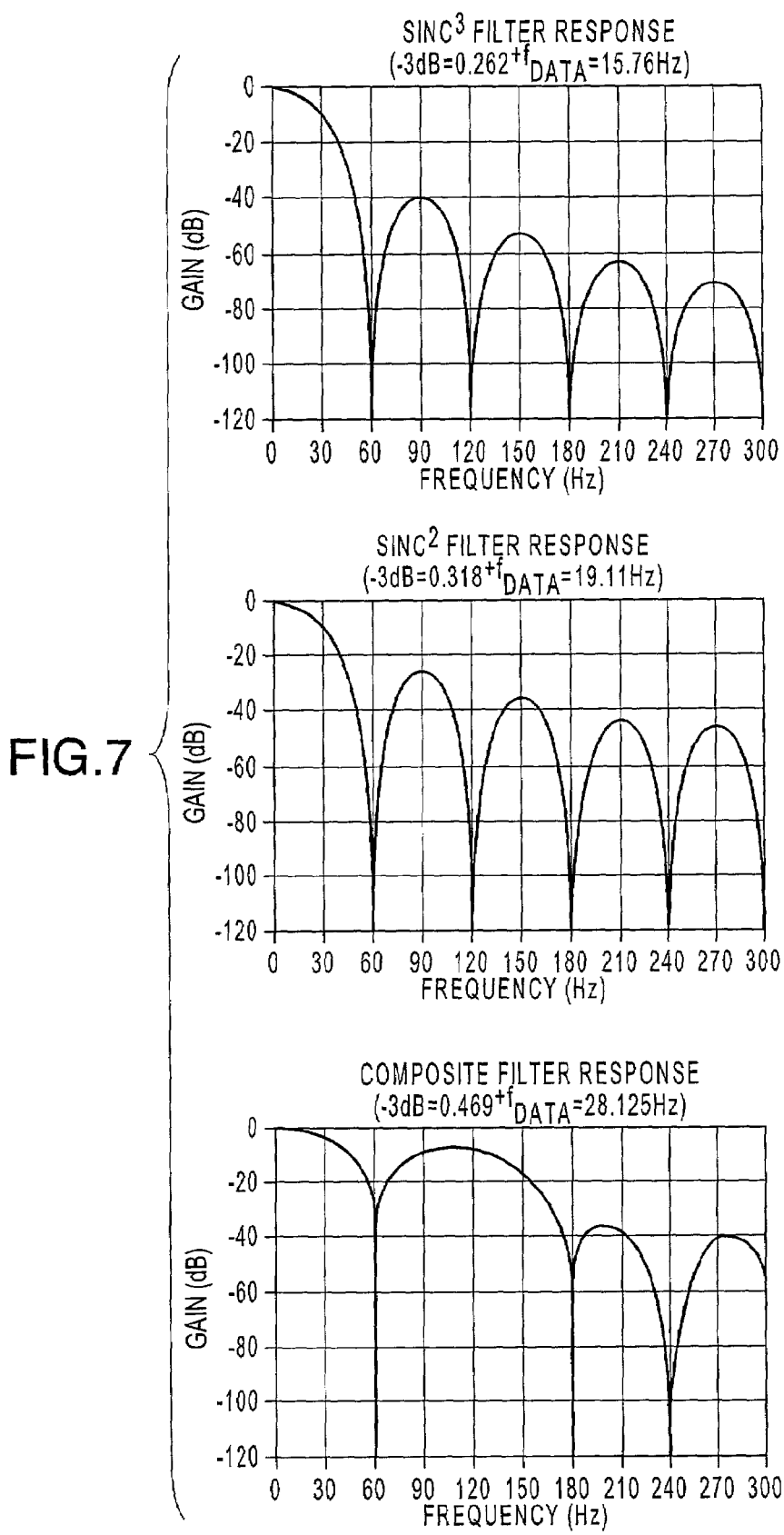
FIG. 7 illustrates an graph of an exemplary filter response for an exemplary embodiment of a filter circuit in accordance with the present invention.

With respect to the faster filter 602 illustrated in FIG. 6, which includes a lower decimation rate, a 60 Hz notch would be moved outside the region for effectively reducing the 60 Hz noise component, for example to four times the 60 Hz notch, or a 240 Hz notch. However, in accordance with an exemplary embodiment, digital filter circuit 600 can also be suitably configured such that first filter 602 is suitably configured with a notch filter 608. In accordance with this embodiment, notch filter 608 is suitably configured to replace the first, third and other odd harmonic notches of first filter 602. Accordingly, with the implementation of notch filter 608, first filter 602 can also be suitably configured to provide a notch at 60 Hz, as illustrated in FIG. 7. In other words, instead of having only a single notch at 240 Hz due to the decimation ratio of N/4, the response of first filter 602 suitably includes a notch at 60 Hz, as well as 180 Hz and 240 Hz.

As a result of the various components, including integrators and differentiators and notch filters, a transfer function can be suitably provided which predicts the output characteristics of digital filter circuit 600. For example, the transfer function in the Z domain for each of filters 602, 604 and 606 can suitably comprise:

$$\text{Sinc}^3 : H(z) = \left( \frac{(1 - z^{-N})}{(1 - z^{-1})} \right)^3$$

$$\text{Sinc}^2 : H(z) = \left( \frac{(1 - z^{-N})}{(1 - z^{-1})} \right)^2$$

-continued $$\text{Sinc}2: H(z) = \left(\frac{\left(1-z^{-\frac{N}{4}}\right)}{(1-z^{-1})}\right)^2 \left(1+z^{-\frac{N}{2}}\right)$$

The present invention has been described above with reference to an exemplary embodiment. However, those skilled in the art will recognize that changes and modifications may be made to the exemplary embodiment without departing from the scope of the present invention. For example, the various components may be implemented in alternate ways, such as, for example, by hardware or software implementations, e.g., the digital filtering could comprise dedicated hardware for performing the filtering functions, or a programmable digital signal processor can be provided with software routines to perform the filtering functions. These alternatives can be suitably selected depending upon the particular application or in consideration of any number of factors associated with the operation of the system. In addition, the techniques described herein may be extended or modified for use with other components besides an analog-to-digital converter. These and other changes or modifications are intended to be included within the scope of the present invention, as expressed in the following claims.

What is claimed is:

1. A digital filter circuit for use in an analog-to-digital converter, said digital filter circuit comprising:
   a first digital filter having a first settling rate and a first level of noise resolution; and
   a second digital filter configured in a parallel arrangement with said first digital filter, said second digital filter having a second settling rate that is slower than said first settling rate and a second level of noise resolution that is higher than said first level of noise resolution, wherein said first digital filter and said second digital filter comprise a composite filter arrangement configured to facilitate a faster settling and response time for said digital filter.

2. A digital filter circuit according to claim 1, wherein said digital filter circuit is configured such that said first digital filter is selected to receive and filter samples of data during a first delay cycle and provide a filtered data output signal corresponding to said samples received during the first delay cycle and said second digital filter is selected to receive and filter a first sample of data during the first delay cycle and a delayed sample of data during a delay cycle subsequent to the first delay cycle and to provide a filtered data output signal corresponding to said samples received during the first delay cycle and the subsequent delay cycle.

3. A digital filter according to claim 1, wherein said digital filter circuit further comprises a third digital filter configured in a parallel arrangement with said first digital filter and said second digital filter, said third digital filter having a third settling rate that is slower than said second settling rate, and a third level of noise resolution that is higher than said second level of noise resolution.

4. A digital filter circuit for use in an analog-to-digital converter, said digital filter circuit comprising:
   a first digital filter having a first settling rate and a first level of noise resolution; and
   a second digital filter configured in a parallel arrangement with said first digital filter, said second digital filter having a second settling rate that is slower than said first settling rate and a second level of noise resolution that is higher than said first level of noise resolution, wherein said first digital filter and said second digital filter comprise a composite filter arrangement configured to facilitate a faster settling and response time for said digital filter,
   wherein said digital filter circuit further comprises a third digital filter configured in a parallel arrangement with said first digital filter and said second digital filter, said third digital filter having a third settling rate that is slower than said second settling rate, and a third level of noise resolution that is higher than said second level of noise resolution, and
   wherein said first digital filter comprises at least a one-delay filter, said second digital filter comprises a two-delay filter, and said third digital filter comprises a three or greater-delay filter.

5. A digital filter circuit for use in an analog-to-digital converter, said digital filter circuit comprising:
   a first digital filter having a first settling rate and a first level of noise resolution; and
   a second digital filter configured in a parallel arrangement with said first digital filter, said second digital filter having a second settling rate that is slower than said first settling rate and a second level of noise resolution that is higher than said first level of noise resolution, wherein said first digital filter and said second digital filter comprise a composite filter arrangement configured to facilitate a faster settling and response time for said digital filter,
   wherein said digital filter circuit further comprises a third digital filter configured in a parallel arrangement with said first digital filter and said second digital filter, said third digital filter having a third settling rate that is slower than said second settling rate, and a third level of noise resolution that is higher than said second level of noise resolution, and
   wherein said first digital filter comprises a sinc1 filter, said second digital filter comprises a sinc2 filter, and said third digital filter comprises a sinc3 filter.

6. A digital filter circuit for use in an analog-to-digital converter, said digital filter circuit comprising:
   a first digital filter having a first settling rate and a first level of noise resolution; and
   a second digital filter configured in a parallel arrangement with said first digital filter, said second digital filter having a second settling rate that is slower than said first settling rate and a second level of noise resolution that is higher than said first level of noise resolution, wherein said first digital filter and said second digital filter comprise a composite filter arrangement configured to facilitate a faster settling and response time for said digital filter,
   wherein said digital filter circuit further comprises a third digital filter configured in a parallel arrangement with said first digital filter and said second digital filter, said third digital filter having a third settling rate that is slower than said second settling rate, and a third level of noise resolution that is higher than said second level of noise resolution, and
   wherein said first digital filter and said second digital filter comprise a sinc2 filter, and said third digital filter comprises a sinc3 filter.

7. A digital filter according to claim 6, wherein said first digital filter is coupled with a notch filter configured to replace a first, third and a subsequent odd-order harmonic notch of said first digital filter.

8. A digital filter according to claim 6, wherein said first filter is configured with a decimation ratio lower than a decimation ratio of said second filter.

9. A digital filter circuit for use in an analog-to-digital converter, said digital filter circuit comprising:
- a first digital filter having a first settling rate and a first level of noise resolution; and
- a second digital filter configured in a parallel arrangement with said first digital filter, said second digital filter having a second settling rate that is slower than said first settling rate and a second level of noise resolution that is higher than said first level of noise resolution, wherein said first digital filter and said second digital filter comprise a composite filter arrangement configured to facilitate a faster settling and response time for said digital filter,
- wherein said digital filter circuit further comprises a third digital filter configured in a parallel arrangement with said first digital filter and said second digital filter, said third digital filter having a third settling rate that is slower than said second settling rate, and a third level of noise resolution that is higher than said second level of noise resolution, and
- wherein said digital filter circuit comprises a switching mechanism for selecting one of said first digital filter, said second digital filter and said third digital filter to receive, filter and output sampled data.

10. A digital filter circuit for use in an analog-to-digital converter, said digital filter circuit comprising:
- a first digital filter having a first settling rate and a first level of noise resolution; and
- a second digital filter configured in a parallel arrangement with said first digital filter, said second digital filter having a second settling rate that is slower than said first settling rate and a second level of noise resolution that is higher than said first level of noise resolution, wherein said first digital filter and said second digital filter comprise a composite filter arrangement configured to facilitate a faster settling and response time for said digital filter,
- wherein said digital filter circuit further comprises a third digital filter configured in a parallel arrangement with said first digital filter and said second digital filter, said third digital filter having a third settling rate that is slower than said second settling rate, and a third level of noise resolution that is higher than said second level of noise resolution, and
- wherein each said first digital filter, said second digital filter, and said third digital filter comprise a separate filter path, and wherein a gain parameter of each said separate filter path is matched to a gain parameter of any other said separate filter path to provide an equalized gain.

11. A digital filter according to claim 9, wherein said gain parameters are matched as a function of a decimation ratio of one of said first digital filter, said second digital filter, and said third digital filter.

12. A digital filter circuit for use in an analog-to-digital converter, said digital filter circuit comprising:
- a first digital filter having a first settling rate and a first level of noise resolution; and
- a second digital filter configured in a parallel arrangement with said first digital filter, said second digital filter having a second settling rate that is slower than said first settling rate and a second level of noise resolution that is higher than said first level of noise resolution, wherein said first digital filter and said second digital filter comprise a composite filter arrangement configured to facilitate a faster settling and response time for said digital filter,
- wherein said digital filter circuit further comprises a third digital filter configured in a parallel arrangement with said first digital filter and said second digital filter, said third digital filter having a third settling rate that is slower than said second settling rate, and a third level of noise resolution that is higher than said second level of noise resolution, and
- wherein the parallel arrangement is configured to provide reduced layout requirements, said third digital filter comprising three integrators in series with three differentiators, said second digital filter shares at least two of said three integrators, and said first digital filter shares at least one of said three integrators.

13. An analog-to-digital converter having a fast settling time, said analog-to-digital filter comprising:
- a multiplexor having a plurality of input channels;
- a modulator for receiving an output from one of said plurality of input channels of said multiplexor; and
- a digital filter circuit for receiving an output from said modulator and for providing a filtered output, said digital filter circuit comprising:
  - a first digital filter having a first settling rate and a first level of noise resolution; and
  - a second digital filter configured in a parallel arrangement with said first digital filter, said second digital filter having a second settling rate that is slower than said first settling rate, and a second level of noise resolution that is higher than said first level of noise resolution, wherein said first digital filter and said second digital filter comprise a composite filter configured to facilitate a faster settling and response time for said digital filter.

14. An analog-to--digital converter according to claim 13, wherein said digital filter circuit further comprises a third digital filter configured in a parallel arrangement with said first digital filter and said second digital filter, said third digital filter having a third settling rate that is slower than said second settling rate, and a third level of noise resolution that is higher than said second level of noise resolution.

15. An analog-to-digital converter according to claim 14, wherein said digital filter circuit is configured such that said first digital filter is selected to receive and filter samples of data during a first delay cycle to provide a first output signal corresponding to said samples received during the first delay cycle, said second digital filter is selected to receive and filter samples of data during the first delay cycle and a second delay cycle to provide a second output signal corresponding to said samples received during the first delay cycle and the second delay cycle, and said third digital filter is selected to receive and filter samples of data during a delay cycle subsequent to the second delay cycle to provide a third output signal corresponding to said samples received during the first delay cycle, the second delay cycle and the subsequent delay cycle.

16. An analog-to-digital converter having a fast settling time, said analog-to-digital filter comprising:
- a multiplexor having a plurality of input channels;
- a modulator for receiving an output from one of said plurality of input channels of said multiplexor; and
- a digital filter circuit for receiving an output from said modulator and for providing a filtered output, said digital filter circuit comprising:
  - a first digital filter having a first settling rate and a first level of noise resolution; and a second digital filter configured in a parallel arrangement with said first digital filter, said second digital filter having a second settling rate that is slower than said first settling rate, and a second level of noise resolution that is higher than said first level of noise resolution, wherein said first digital filter and said second digital filter comprise a composite filter configured to facilitate a faster settling and response time for said digital filter, wherein said digital filter circuit further comprises a third digital filter configured in a parallel arrangement with said first digital filter and said second digital filter, said third digital filter having a third settling rate that is slower than said second settling rate, and a third level of noise resolution that is higher than said second level of noise resolution, wherein the parallel arrangement is configured to provide reduced layout requirements, said third digital filter comprising three integrators in series with three differentiators, said second digital filter shares at least two of said three integrators, and said first digital filter shares at least one of said three integrators.

17. An analog-to-digital converter having a fast settling time, said analog-to-digital filter comprising:
a multiplexor having a plurality of input channels;
a modulator for receiving an output from one of said plurality of input channels of said multiplexor; and
a digital filter circuit for receiving an output from said modulator and for providing a filtered output, said digital filter circuit comprising:
a first digital filter having a first settling rate and a first level of noise resolution; and
a second digital filter configured in a parallel arrangement with said first digital filter, said second digital filter having a second settling rate that is slower than said first settling rate, and a second level of noise resolution that is higher than said first level of noise resolution, wherein said first digital filter and said second digital filter comprise a composite filter configured to facilitate a faster settling and response time for said digital filter, wherein said digital filter circuit further comprises a third digital filter configured in a parallel arrangement with said first digital filter and said second digital filter, said third digital filter having a third settling rate that is slower than said second settling rate, and a third level of noise resolution that is higher than said second level of noise resolution, wherein said third digital filter comprises an order of delay configuration one order higher than an order configuration of said modulator.

18. A digital filter circuit for use in an analog-to-digital converter, said digital filter circuit comprising:
a first digital filter selected to receive and filter samples of data during an initial delay cycle and provide a first output data signal corresponding to the samples received during the initial delay cycle; and
a second digital filter having a settling rate that is slower than a settling rate of said first digital filter, and a level of noise resolution that is higher than a level of noise resolution of said first digital filter, said second digital filter being selected to receive and filter samples of data during a subsequent delay cycle and to provide a second output data signal corresponding to samples received during the subsequent delay cycle, and
wherein said first digital filter and said second digital filter are configured in a composite arrangement to facilitate a faster settling and response time for said digital filter.

19. A digital filter according to claim 18, wherein said digital filter circuit further comprises a third digital filter having a settling rate that is slower than said settling rate of said second digital filter, and a level of noise resolution that is higher than said level of noise resolution of said second digital filter.

20. A digital filter circuit for use in an analog-to-digital converter, said digital filter circuit comprising:
a first digital filter selected to receive and filter samples of data during an initial delay cycle and provide a first output data signal corresponding to the samples received during the initial delay cycle; and
a second digital filter having a settling rate that is slower than a settling rate of said first digital filter, and a level of noise resolution that is higher than a level of noise resolution of said first digital filter, said second digital filter being selected to receive and filter samples of data during a subsequent delay cycle and to provide a second output data signal corresponding to samples received during the subsequent delay cycle, and
wherein said first digital filter and said second digital filter are configured in a composite arrangement to facilitate a faster settling and response time for said digital filter,
wherein said digital filter circuit further comprises a third digital filter having a settling rate that is slower than said settling rate of said second digital filter, and a level of noise resolution that is higher than said level of noise resolution of said second digital filter, and
wherein said first digital filter comprises at least a one-delay filter, said second digital filter comprises a two-delay filter, and said third digital filter comprises at least a three-delay filter.

21. A digital filter circuit for use in an analog-to-digital converter, said digital filter circuit comprising:
a first digital filter selected to receive and filter samples of data during an initial delay cycle and provide a first output data signal corresponding to the samples received during the initial delay cycle; and
a second digital filter having a settling rate that is slower than a settling rate of said first digital filter, and a level of noise resolution that is higher than a level of noise resolution of said first digital filter, said second digital filter being selected to receive and filter samples of data during a subsequent delay cycle and to provide a second output data signal corresponding to samples received during the subsequent delay cycle, and
wherein said first digital filter and said second digital filter are configured in a composite arrangement to facilitate a faster settling and response time for said digital filter,
wherein said digital filter circuit further comprises a third digital filter having a settling rate that is slower than said settling rate of said second digital filter, and a level of noise resolution that is higher than said level of noise resolution of said second digital filter, and
wherein each of said first digital filter and said second digital filter comprise a sinc2 filter, and said third digital filter comprises a sinc3 filter.

22. A digital filter circuit for use in an analog-to-digital converter, said digital filter circuit comprising:
a first digital filter selected to receive and filter samples of data during an initial delay cycle and provide a first output data signal corresponding to the samples received during the initial delay cycle; and
a second digital filter having a settling rate that is slower than a settling rate of said first digital filter, and a level of noise resolution that is higher than a level of noise resolution of said first digital filter, said second digital filter being selected to receive and filter samples of data during a subsequent delay cycle and to provide a second output data signal corresponding to samples received during the subsequent delay cycle, and wherein said first digital filter and said second digital filter are configured in a composite arrangement to facilitate a faster settling and response time for said digital filter, wherein said digital filter circuit further comprises a third digital filter having a settling rate that is slower than said settling rate of said second digital filter, and a level of noise resolution that is higher than said level of noise resolution of said second digital filter, and wherein said first digital filter is coupled with a notch filter configured to replace a first, third and a subsequent odd-order harmonic notch of said first digital filter.

23. A digital filter according to claim 19, wherein said first digital filter is configured with a lower decimation rate than said second digital filter and said third digital filter.

24. A digital filter according to claim 19, wherein each said first digital filter comprises a first filter path having a first gain component, said second digital filter comprises a second filter path having a second gain component, and said third digital filter comprises a third filter path having a third gain component, and wherein said digital filter circuit includes at least two multipliers configured within said two of said filter paths, said multipliers configured to provide equalized gains within each said filter paths.

25. A method of providing for the faster settling of data by a digital filter after the switching of input channels in a multiplexor used in an analog-to-digital converter, said method comprising the steps of:

selecting a first digital filter to receive samples of data from an output of a modulator during a first delay cycle, said first digital filter having a first settling rate and a first level of noise resolution;

providing a filtered data output signal corresponding to said samples received during the first data cycle;

selecting a second digital filter to receive samples of data from the output of the modulator during the first delay cycle and a subsequent delay cycle, said second digital filter configured in a parallel arrangement with said first digital filter and having a second settling rate that is slower than said first settling rate and a second level of noise resolution that is higher than said first level of noise resolution; and providing a filtered data output signal corresponding to said samples received during the first delay cycle and the subsequent data cycle, wherein said first digital filter and said second digital filter are configured in a composite arrangement to facilitate a faster settling and response time for said digital filter.

26. A method according to claim 25, wherein said second digital filter receives samples of data from the output of the modulator during a second delay cycle and provides a filtered data output signal corresponding to said samples received during the second delay cycle, and wherein said method further comprises the steps of:

selecting a third digital filter to receive samples of data from the output of the modulator during a delay cycle subsequent to the second delay cycle, said third digital filter configured in a parallel arrangement with said second digital filter and having a third settling rate that is slower than said second settling rate and a third level of noise resolution that is higher than said second level of noise resolution; and providing a filtered data output signal corresponding to said samples received during the delay cycle subsequent to the second delay cycle.

27. A method of providing for the faster settling of data by a digital filter after the switching of input channels in a multiplexor used in an analog-to-digital converter, said method comprising the steps of:

selecting a first digital filter to receive samples of data from an output of a modulator during a first delay cycle, said first digital filter having a first settling rate and a first level of noise resolution;

providing a filtered data output signal corresponding to said samples received during the first data cycle;

selecting a second digital filter to receive samples of data from the output of the modulator during the first delay cycle and a subsequent delay cycle, said second digital filter configured in a parallel arrangement with said first digital filter and having a second settling rate that is slower than said first settling rate and a second level of noise resolution that is higher than said first level of noise resolution; and providing a filtered data output signal corresponding to said samples received during the first delay cycle and the subsequent data cycle, wherein said first digital filter and said second digital filter are configured in a composite arrangement to facilitate a faster settling and response time for said digital filter, wherein said second digital filter receives samples of data from the output of the modulator during a second delay cycle and provides a filtered data output signal corresponding to said samples received during the second delay cycle, and wherein said method further comprises the steps of:

selecting a third digital filter to receive samples of data from the output of the modulator during a delay cycle subsequent to the second delay cycle, said third digital filter configured in a parallel arrangement with said second digital filter and having a third settling rate that is slower than said second settling rate and a third level of noise resolution that is higher than said second level of noise resolution; and providing a filtered data output signal corresponding to said samples received during the delay cycle subsequent to the second delay cycle, wherein said method further comprises the step of matching a gain parameter of a filter path for each of said first filter, said second filter and said third filter to provide an equalized gain.

28. A method of providing for the faster settling of data by a digital filter after the switching of input channels in a multiplexor used in an analog-to-digital converter, said method comprising the steps of:

selecting a first digital filter to receive samples of data from an output of a modulator during a first delay cycle, said first digital filter having a first settling rate and a first level of noise resolution;

providing a filtered data output signal corresponding to said samples received during the first data cycle;

selecting a second digital filter to receive samples of data from the output of the modulator during the first delay cycle and a subsequent delay cycle, said second digital filter configured in a parallel arrangement with said first digital filter and having a second settling rate that is slower than said first settling rate and a second level of noise resolution that is higher than said first level of noise resolution; and providing a filtered data output signal corresponding to said samples received during the first delay cycle and the subsequent data cycle, wherein said first digital filter and said second digital filter are configured in a composite arrangement to facilitate a faster settling and response time for said digital filter, wherein said second digital filter receives samples of data from the output of the modulator during a second delay cycle and provides a filtered data output signal corresponding to said samples received during the second delay cycle, and wherein said method further comprises the steps of:

selecting a third digital filter to receive samples of data from the output of the modulator during a delay cycle subsequent to the second delay cycle, said third digital filter configured in a parallel arrangement with said second digital filter and having a third settling rate that is slower than said second settling rate and a third level of noise resolution that is higher than said second level of noise resolution; and providing a filtered data output signal corresponding to said samples received during the delay cycle subsequent to the second delay cycle, wherein said first filter is configured with a notch filter for replacing a first, third any a subsequent odd-order harmonic notch of said first filter circuit.

* * * * *